United States Patent [19]

Iwahashi et al.

[11] 4,185,321

[45] Jan. 22, 1980

[54] SEMICONDUCTOR MEMORY WITH PULSE CONTROLLED COLUMN LOAD CIRCUIT

[75] Inventors: Hiroshi Iwahashi; Seigo Suzuki, both of Yokohama, Japan

[73] Assignee: Tokyo Shibaura Electric Co., Ltd., Japan

[21] Appl. No.: 889,012

[22] Filed: Mar. 22, 1978

[30] Foreign Application Priority Data

Mar. 24, 1977 [JP] Japan .................................. 52-32400

[51] Int. Cl.² .......................... G11C 7/00; G11C 7/06
[52] U.S. Cl. .................................. 365/204; 365/203; 365/227
[58] Field of Search ................ 365/203, 204, 227, 189

[56] References Cited

U.S. PATENT DOCUMENTS

| | | | |
|---|---|---|---|
| 3,932,848 | 1/1976 | Porat | 365/204 |
| 3,969,706 | 7/1976 | Proebsting et al. | 365/203 |

OTHER PUBLICATIONS

Cordaro, Read—Only Storage Bit Precharge/Sense Circuit, IBM Technical Disclosure Bulletin, vol. 17, No. 4, Sep. 1974, p. 1044.

Primary Examiner—Stuart N. Hecker
Attorney, Agent, or Firm—Finnegan, Henderson, Farabow & Garrett

[57] ABSTRACT

A semiconductor memory device comprises a matrix array of a plurality of memory cells wherein a load circuit connected to column lines of the matrix array for charging the column lines is enabled to provide different resistance values between the actions of charging and discharging the column lines.

34 Claims, 26 Drawing Figures

FIG. 2B CONTROL C

FIG. 2C CHIP SELECT

SEMICONDUCTOR MEMORY WITH PULSE CONTROLLED COLUMN LOAD CIRCUIT

BACKGROUND OF THE INVENTION

This invention relates to a semiconductor memory device and particularly to a semiconductor memory device capable of a rapid read-out of stored data.

Thanks to recent developments of art in semiconductors, many types of semiconductor memory devices have been proposed for the purpose of data storing. Memory devices capable of a rapid read-out of stored data have been demanded to expedite the overall speed of data processing. Upon detection of stored data in such a memory device, column lines in a memory array of memory cells consisting of a matrix array of MOS transistors (hereinafter called MOS FET's) are charged by means of a pull-up transistor, and when one of the column lines is coupled with a selected one of the memory cells, a charge on the column line either is or is not discharged in response to a binary content in the cell. A voltage sensor connected with the column lines detects the charge of the column line to generate an output signal indicative of a binary content in the cell. It is thus apparent that periods of time for charging the column lines and discharging the charge therefrom must be shortened for providing a rapid read-out of data in a semiconductor memory device. It is preferred that the pull-up transistor have a sufficiently small conduction resistance to permit a rapid action of charging the column lines. A pull-up transistor which has a small conduction resistance, however, forms a resistance to the discharging action of the charge on the column lines, thus resulting in a lengthened time of discharging action. It is therefore desired that a pull-up transistor have a low resistance upon the charging action and a high resistance upon the discharging action of a semiconductor memory device; but, it is not feasible to so change a resistance value of the pull-up transistor, so that a period of time for only either one of the charging or the discharging actions has been proposed in the prior art to be shortened at the cost of another.

SUMMARY OF THE INVENTION

Accordingly, one of the objects of the invention is to provide a semiconductor memory device capable of a rapid read-out of stored data.

Another object of the invention is to provide a semiconductor memory device capable of rapid actions of charging and discharging the column lines.

Still another object of the invention is to provide a semiconductor memory device having a reduced consumption of electric power.

A further object of the invention is to provide a semiconductor memory device where a load circuit connected with the column lines has a variable resistance value.

A still further object of the invention is to provide a semiconductor memory device where a load element connected with the column lines has a variable resistance value which is lowered and raised upon actions of charging and discharging the column lines, respectively, to expedite both actions, thus permitting a rapid read-out of stored data.

A semiconductor memory device is provided according to the invention which comprises a plurality of row lines, a plurality of memory cells controlled by a signal applied to said plurality of row lines, a plurality of column lines connected with said plurality of memory cells, voltage sensor means connected with said plurality of column lines, column line select means for selecting one of said plurality of column lines, a load circuit connected between said plurality of column lines and power source terminal, and means for varying a resistance value of said load circuit.

DESCRIPTION OF THE PREFERRED EMBODIMENTS

Figure 1:
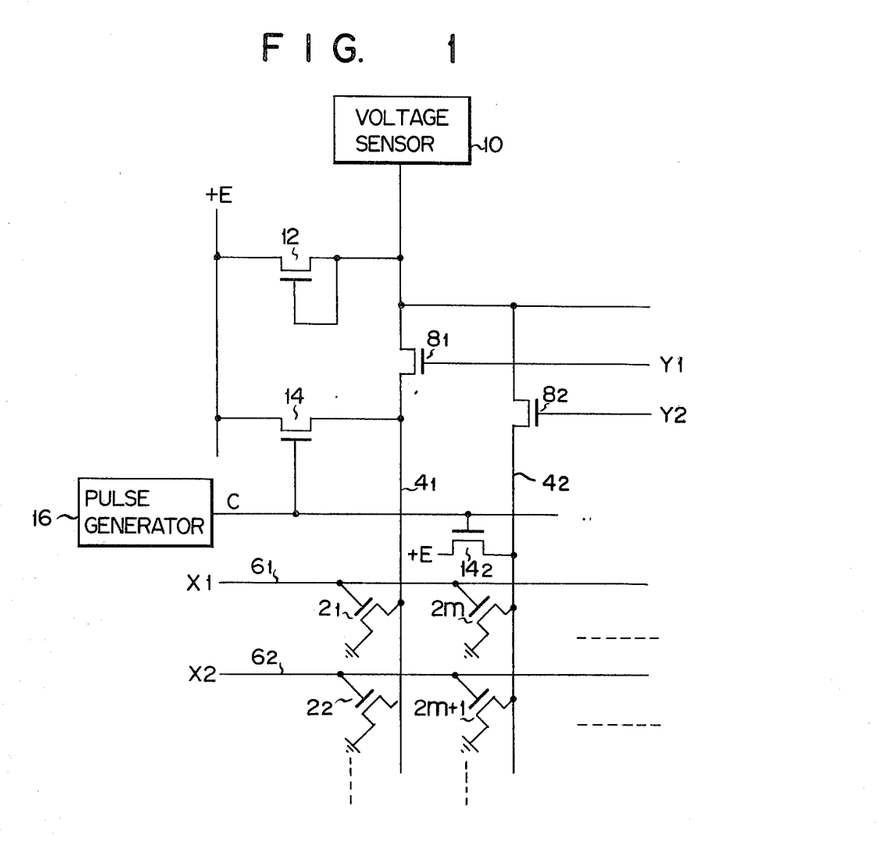
FIG. 1 diagrammatically shows a semiconductor memory device according to one embodiment of the invention.

Reference is made of FIG. 1 in which numerals $2_1$, $2_2$, ... $2_m$, $2_{m+1}$, ... designate MOS FET's (Metal-Oxide-Semiconductor Field Effect Transistors) each constituting a memory cell. The abbreviation, "MOS FET", as used herein, is intended to mean a MOS FET of N-channel type and, unless otherwise specified, of enhancement type. The MOS FET's in each row are connected at the gates by one common row line. In accordnace with a program to be established, some of the MOS FET's in each column are, but at least one thereof is not, connected at the drains with one common column line. The drain of MOS FET $2_1$ is connected with a column line $4_1$, while that of MOS FET $2_2$ in the same column as the former is not connected but remains open. The drains of MOS FET's $2_m$ and $2_{m+1}$ are connected with a common column line $4_2$. The gates of the MOS FET's $2_1$ and $2_m$ are connected by a common row line $6_1$, while the gates of the MOS FET's $2_2$ and $2_{m+1}$ are connected by a common row line $6_2$. The column line $4_1$ is connected through the source-drain path of a column select MOS FET $8_1$ to a voltage sensor 10. Similarly, the column line $4_2$ is connected through the source-drain path of a column select MOS FET $8_2$ to the voltage sensor 10. The column line $4_1$ is connected with a power source +E by the intermediary of a pair of MOS FET's, or a MOS FET 12 of depletion type and another 14 of enhancement type (which may be depletion type) connected in parallel with each other to form a pull-up load element for charging the column line $4_1$. The gate and source of MOS FET 12 are commonly connected with each other. Row lines $6_1, 6_2$ . . . are applied with output signals $X_1, X_2$ . . . issued from a row line decoder (not shown), and the gates of MOS FET's $8_1, 8_2$ . . . in column lines $4_1, 4_2$ . . . are applied with output signals $Y_1, Y_2$ . . . issued from a column line decoder (not shown). A pulse generator 16 is connected with the gate of the MOS FET 14 for application of a control signal C thereto.

Figures 2A, 2B:
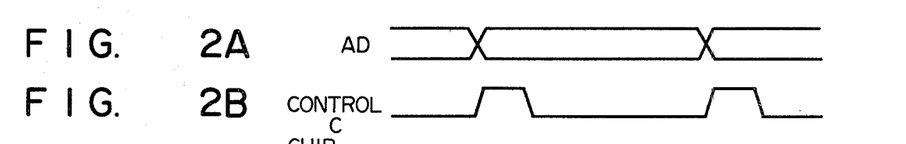
FIGS. 2A–2C show waveforms for the purpose of explaining the operation of the memory device of FIG. 1.
Figure 2C:
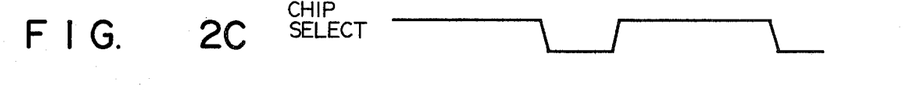

In a memory device of the above stated arrangement, the gate of MOS FET 14 is applied with control pulse signal C which is generated, as shown in FIG. 2, in synchronism with the switching time of address signal AD. A chip select signal is shown in FIG. 2C, and during the chip select signal being maintained at "1" level, an address signal AD and control signal C become "1" level. However, the control signal C may be changed to "1" level during the chip select signal being maintained at "0" level. That is, an address signal AD may be changed during the chip select signal being maintained at "0" level. The pulse width of control signal C is selected to have a length equivalent to the longest one of periods of time required for column lines $4_1, 4_2, \ldots$ to be charged, for row lines to be switched after the row line decoder output signals have been switched, and for column lines to be switched after the column select address signals have been switched. When a pair of one column and one row lines are designated, one memory cell MOS FET is designated. Charge on the column line either is or is not discharged in response to a binary content which has been stored in the memory cell MOS FET in accordance with the established program. Voltage sensor 10 detects the charge change produced on the column line by the discharge or the nondischarge of charge thereon, in order to generate an output signal.

The actions of charging and discharging column lines in the memory device of FIG. 1 will be described.

Suppose that, upon the charging action, none of the column lines $4_1, 4_2, \ldots$ is coupled with the memory cell MOS FET's $2_1, 2_2, \ldots 2_m, 2_{m+1}, \ldots$ A high-level or "38 level pulse signal is applied to the gate of pull-up MOS FET 14 acting as a pull-up load element, thereby to render the MOS FET 14 conductive, a current being thus permitted to flow through the drain-source path thereof to charge the column line $4_1$. The MOS FET 12 is kept conductive because of depletion type and of its gate being, as above stated, connected commonly with its own source, so that the column line $4_1$ is charged also with a current flowing through the MOS FET 12. Thus a resistance to charge the column line $4_1$ has an equal value to the parallel resistance value of conduction resistances of the MOS FET's 14 and 12 through which the column line $4_1$ is charged and, therefore has a smaller value than when MOS FET 14 is not provided. It is thus apparent that the arrangement can enhance an efficiency of the action of charging the column line $4_1$ and shorten a period of time required therefor in comparison with the prior art arrangement. Moreover, when a conduction resistance of the MOS FET 14 is selected to be of a small value, the parallel resistance value upon the charging action will be still more reduced, thus more shortening a period of time for the charging action.

Supposing that the column line $4_1$ and the row line $6_1$ are selected by application of column and row line decoder output signals $Y_1$ and $X_1$, respectively, the column line $4_1$ is then coupled to the memory cell MOS FET $2_1$. As the latter is conductive, the charge stored on the column line $4_1$ will be discharged therefrom. At this time, the MOS FET 14 is non-conductive because control signal C applied to MOS FET 14 lies on the low or "0" level, so that a resistance present in the load circuit of MOS FET's 12 and 14 is constituted only by a conduction resistance of the MOS FET 12. Accordingly, particularly when such a conduction resistance of the MOS FET 12 is selected to be of a great value, the action of discharging a charge from the column line $4_1$ can be expedited correspondingly. With a great conduction resistance of the MOS FET 12, moreover, an electric power consumed is much reduced during control signal C being on "0" level. It is thus understood that the memory device of FIG. 1 has the arrangement where a pair of pull-up MOS FET's 12 and 14 are connected in parallel with each other between column lines $4_1, 4_2, \ldots$ and the power source to form a load circuit for charging the column lines, wherein the MOS FET's 12 and 14 are enabled to provide different composite resistances for the discharging action from that for the charging action.

Figures 3, 4:
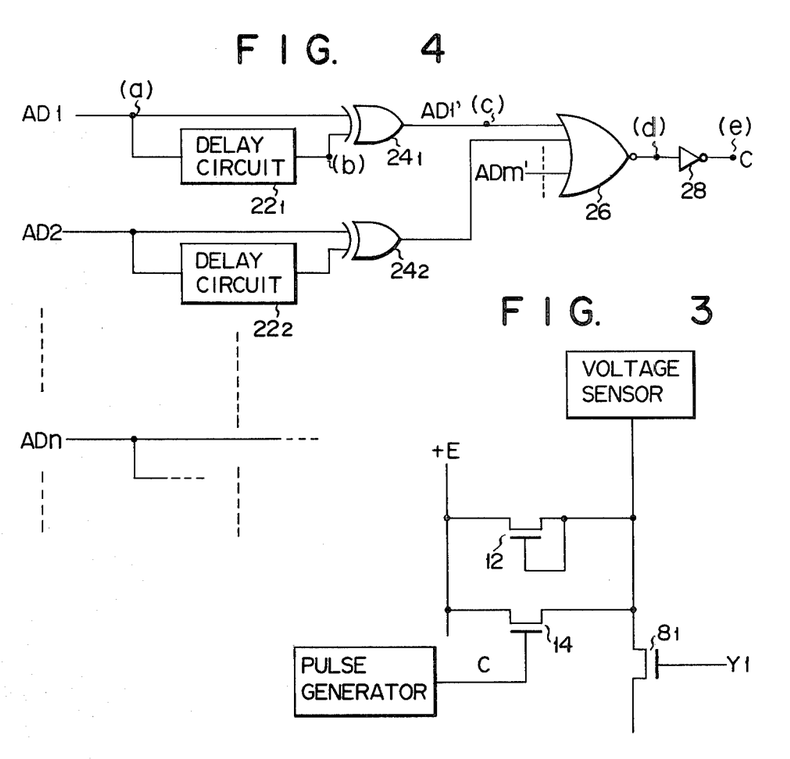
FIG. 3 diagrammatically shows a semiconductor memory device according to another embodiment of the invention.
FIG. 4 shows a circuit block diagram of a pulse signal generator for generating a control signal to be applied to a load MOS FET of the memory device of FIG. 1.

While pull-up MOS FET 14 in the embodiment of FIG. 1 is connected between the source of the column line select MOS FET $8_1$ and the source +E, the same pull-on MOS FET 14 may be connected between the drain, instead of the source, of the column line select MOS FET $8_1$ and the source +E as illustrated in FIG. 3.

In the embodiment in FIG. 3 as in FIG. 1, the pulse width of control signal C is selected to have an equivalent length to the longest one of periods of time required for column lines $4_1, 4_2, \ldots$ to be charged, for row lines to be switched after the row line decoder output signals have been switched, and for column lines to be switched after the column line decoder output signals have been switched.

There is shown in FIG. 4 a diagram of one exemplary circuit for deriving the control signal C as shown in FIG. 2 to be applied to the pull-up MOS FET 14 of load circuit. The control signal generator circuit is formed by delay circuits $22_1, 22_2, \ldots$ for receiving address signals $AD_1, AD_2, \ldots$, exclusive-OR circuits $24_1, 24_2, \ldots$ each having one of the input terminals coupled to output signal $AD_1, AD_2, \ldots$ and the other coupled to an output signal of the delay circuit $22_1, 22_2, \ldots$, a NOR circuit 26 receiving output signals of the exclusive-OR circuits $24_1, 24_2, \ldots$, and an inverter 28 for inverting an output signal from the NOR circuit 26.

Figures 5A, 5B:
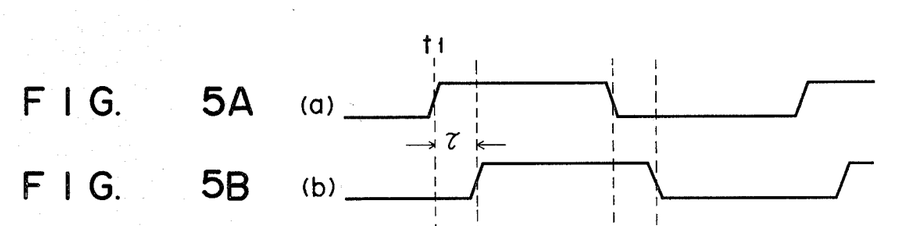
FIGS. 5A–5E show waveforms derived from various points in the pulse signal generator of FIG. 4.
Figure 5C:
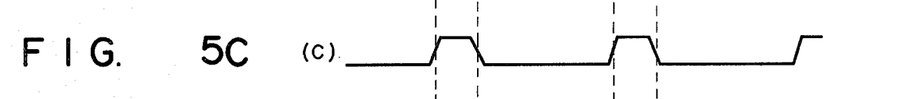
Figures 5D, 5E:
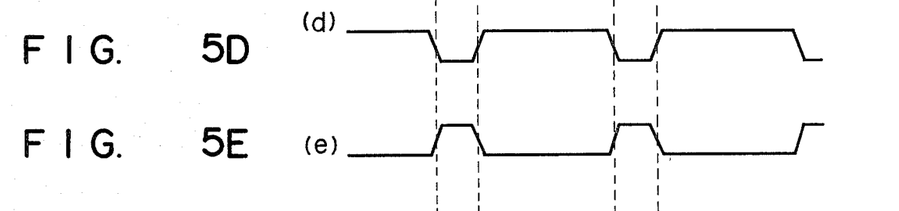

The operation of the circuit of FIG. 4 will be described with reference to FIG. 5, FIGS. 5A to 5E of which show waveforms of signals derived at points a, b, c, d and e in the circuit diagram of FIG. 4, respectively. When an address signal at point a becomes high or "1" level at a time of $t_1$, the "1" level signal is fed to the one of terminals of OR circuit $24_1$, and also to delay circuit $22_1$ which produces a signal delayed by a determined length of time as shown in FIG. 5B. Thus, exclusive-OR circuit $24_1$ which can produce an output signal only while two input signals have different levels produces an output signal during a length of time between application of address signal $AD_1$ and of the output signal derived from the delay circuit $22_1$. In other words, the output signal of exclusive-OR circuit $24_1$ has an equal pulse width to a delay time $\tau$ of delay circuit $22_1$ and the pulse width thereof can be thus changed by controlling the delay time of delay circuit $22_1$. The output signal is fed to the NOR circuit 26. An equal number of similar signals are fed thereto to the total number of addresses provided. Responsive to application of the output signal of FIG. 5C from exclusive OR circuit $24_1$, the NOR circuit 26 produces an inverted-phase signal as shown in FIG. 5D which is then inverted by the inverter 28 into a signal of a waveform shown in FIG. 5E. The latter signal is to be applied to the gate of MOS FET 14 of the memory device of FIG. 1.

Figure 6:
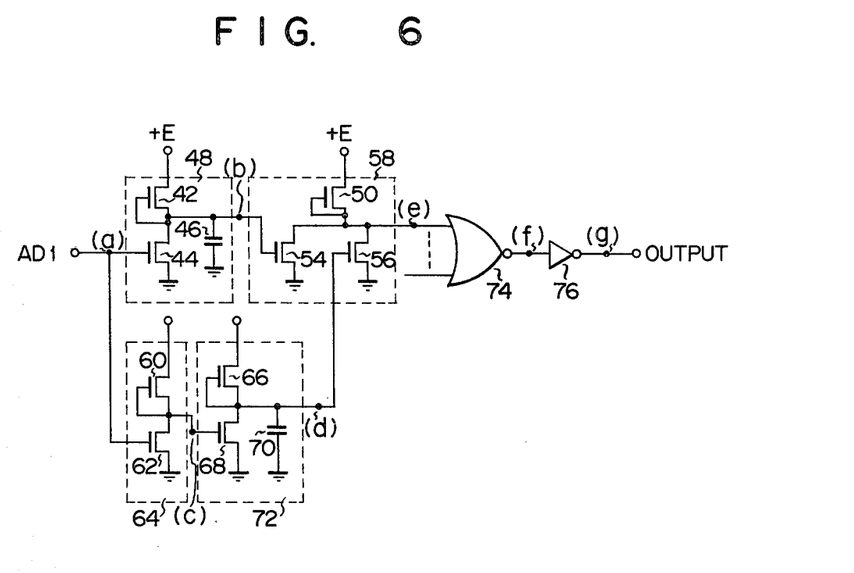
FIG. 6 shows a circuit diagram of another mode of pulse signal generator.
Figure 7A:
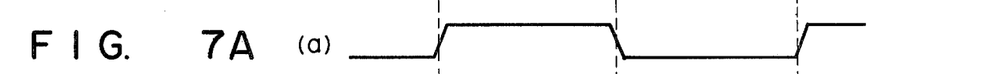
FIGS. 7A–7G show waveforms derived from various points in the pulse signal generator of FIG. 6.
Figures 7B, 7C:
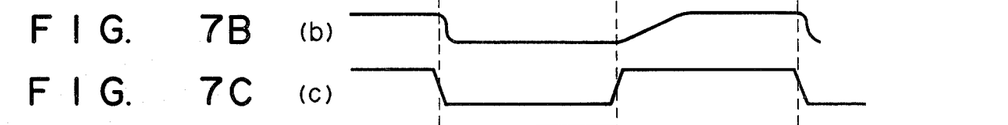
Figures 7D, 7E:
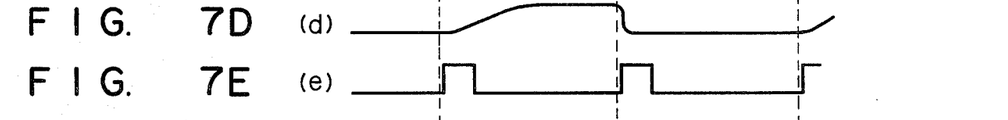
Figure 7F:
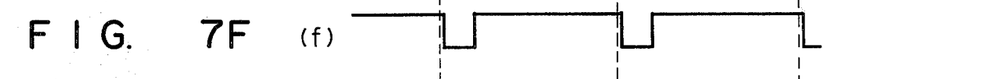
Figure 7G:
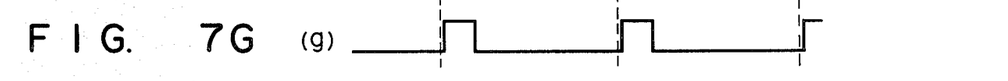

The circuit of FIG. 4 has the complicated arrangement wherein four two-input NAND circuits are required for each of the exclusive-OR circuits $24_1$, $24_2$, .. . A simplified alternative arrangement is shown in FIG. 6. Waveforms derived at points a, b, c, d, e, f, and g in the alternative circuit of FIG. 6 are shown in FIGS. 7A to 7G, respectively. The circuit of FIG. 6 has depletion type MOS FET 42, enhancement type MOS FET 44 and capacitor 46 to form an inverter 48 capable of producing an output signal of a waveform having slow rise and rapid fall. An address signal $AD_1$ shown in FIG. 7A is converted by means of the inverter 48 into a signal, as shown in FIG. 7B, of a waveform having rapid fall and slow rise. Depletion type MOS FET 50, and enhancement type MOS FET's 54 and 56 are connected to form a NOR circuit 58, and the signal of FIG. 7B from the inverter 48 is fed to the gate of MOS FET 54 in the NOR circuit 58. The address signal $AD_1$ of FIG. 7A is fed, on the other hand, to an inverter 64 of depletion type MOS FET 60 and enhancement type MOS FET 62, in which the same is inverted into a signal shown in FIG. 7C. The latter is converted to a waveform shown in FIG. 7D by means of an inverter 72 which is formed by depletion and enhancement type MOS FET's 66 and 68 and capacitor 70 to permit production of an output pulse of a waveform having slow rise and rapid fall. The output signal of FIG. 7D from inverter 72 is fed to the gate of MOS FET 56 in NOR circuit 58. Thus, the NOR circuit 58 has a pair of input signals, one of which is the signal of FIG. 7B and the other of which is the signal of FIG. 7D applied to the gates of MOS FET's 54 and 56, respectively. A pulse signal is derived from NOR circuit 58 which has, as shown in FIG. 7E, a width determined by a lapse of time until either one of these input signals rises to a determined level, and is fed to a NOR circuit 74 from which responsively derived is a signal in an inverted phase shown in FIG. 7F. The output of the NOR circuit 74 is fed to an inverter 76 in which the phase of input signal is reversed to derive a signal shown in FIG. 7G. The signal of FIG. 7G constitutes control signal C applied to the gate of MOS FET 14 in the memory device of FIG. 1. In the arrangement stated with reference to FIGS. 6 and 7, conduction resistance of load MOS FET's 42 and 66 for inverters 48 and 72 is determined to have a great value thereby to permit their output signals to slowly rise to "1" level, but falling of such output signals to "0" level may be rendered slow by providing a small value of conduction resistance of MOS FET's 42 and 66. In the latter case, provision of the inverter 76 is unnecessary.

Figure 8:
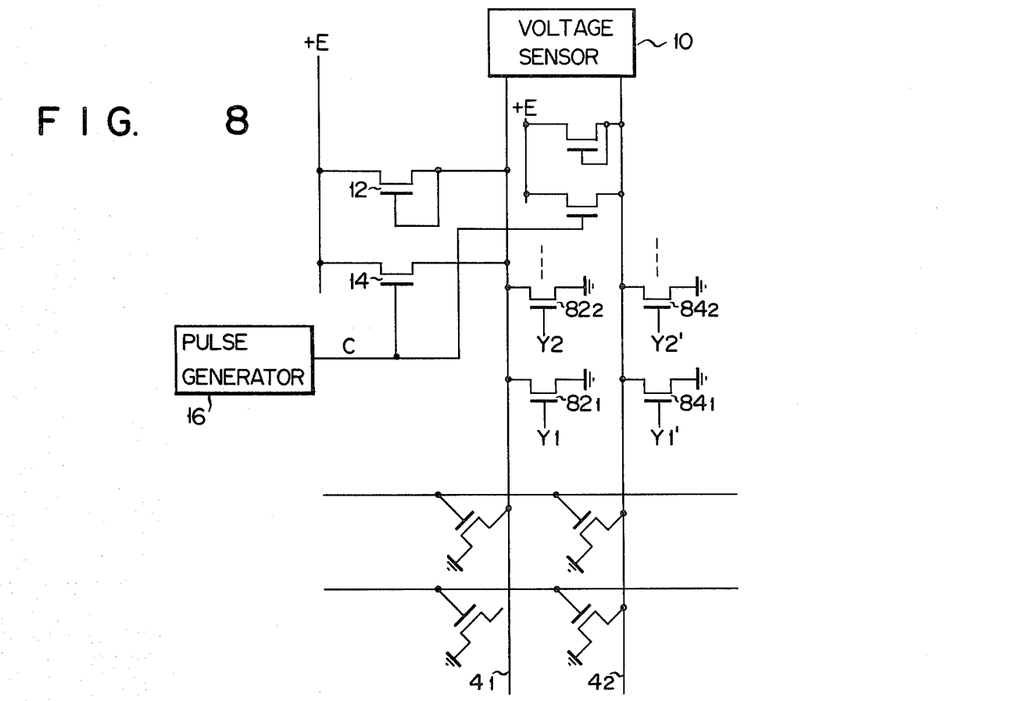
FIG. 8 diagrammatically shows a memory device according to still another embodiment of the invention.

FIG. 8 shows still another embodiment of the invention in which the voltage sensor 10 is directly connected with column lines $4_1$, $4_2$, . . . , without the intermediary of MOS FET's $8_1$, $8_2$, . . . . Similar elements are designated in FIG. 8 by similar reference numerals as used in FIG. 1 for the corresponding ones and the description of these elements is to be omitted herefrom. A pair of pull-up MOS FET's 12 and 14 are similarly connected in parallel between column lines $4_1$, $4_2$, . . . and source $+E$. A plurality of MOS FET's $82_1$, $82_2$, . . . with their respective sources grounded are commonly connected at the drains with column line $4_1$, and another plurality of MOS FET's $84_1$, $84_2$, . . . with their respective sources grounded are similarly connected with column line $4_2$. Column line decoder output signals $Y_1$, $Y_2$, . . . and $Y'_1$, $Y'_2$, . . . are applied to the gates of MOS FET's $82_1$, $82_2$, . . . and $84_1$, $84_2$, . . . , respectively. When one column line, say line $4_1$ is to be selected, all column line decoder output signals $Y_1$, $Y_2$, . . . stay on "0" level, i.e. MOS FET's $82_1$, $82_2$, . . . are non-conductive. When at least one of column line decoder output signals $Y_1$, $Y_2$, . . . coupled to MOS FET's $82_1$, $82_2$, . . . becomes "1" level, the corresponding one of MOS FET's $82_1$, $82_2$, . . . becomes conductive in response, so that column line $4_1$ is not to be selected. Actions of charging and discharging column lines $4_1$, $4_2$, . . . are made in a substantially similar manner as hereinabove described concerning the embodiment of FIG. 1, and therefore will not be described again. The pair of MOS FET's 12 and 14 forming a load circuit in the embodiment of FIG. 8 have conduction resistance of a variable value thereby to expedite the actions of charging and discharging the column lines, thus permitting an increased speed of data read-out.

In the embodiment of FIG. 8 as in FIGS. 1 and 3, the pulse width of control signal C is selected to have an equivalent length to the longest one of periods of time required for column lines $4_1$, $4_2$, . . . to be charged, and for row lines to be switched after the row line decoder output signals have been switched, and for column lines to be switched after the column line decoder output signals have been switched.

Figures 9, 10:
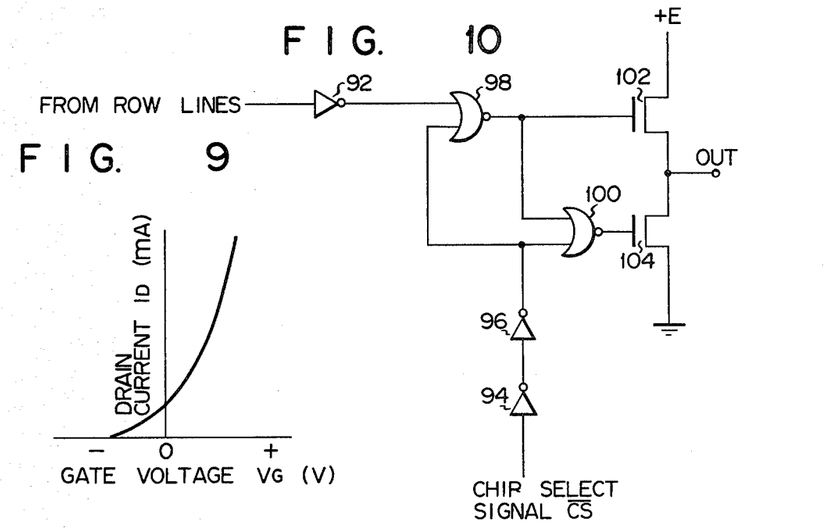
FIG. 9 shows a curve of gate voltage-drain current characteristics of a depletion-type MOS FET.
FIG. 10 shows one exemplary logic diagram circuit of the voltage sensor of each of the memory device of FIGS. 1, 3 and 8.

The invention is not restricted to the foregoing embodiments, but the enhancement-type MOS FET 14 in the embodiment of FIG. 1 may be replaced by a depletion type MOS FET to remove the MOS FET 12. The modification is feasible because a depletion type MOS FET has gate voltage $V_G$ to drain current $I_D$ characteristics, as shown in FIG. 9, that a resistance value is great when a gate voltage lies in proximity to "0", and is gradually reduced as the voltage rises from "0" level. Specifically, when control signal C to MOS FET 14 has "1" level, i.e., upon the action of charging column lines, the depletion type MOS FET presents a reduced resistance to expedite the charging action, while when control signal C has "0" level, the MOS FET presents an increased resistance to facilitate the action of discharging potential from column lines. The modification thus obviously achieves a comparable effect to that of the embodiments.

Although the embodiments are hereinabove described to have an N-channel MOS FET's, P-channel MOS FET's may be used in the light of polarity of the power source.

The voltage sensor of FIG. 1 may be constructed, as shown in FIG. 10, of an inverter 92 for inverting the level of a detection signal derived from column lines, an inverter 94 for inverting the level of a chip select $\overline{CS}$ signal, an inverter 96 for inverting an output signal from the inverter 94, a NOR circuit 98 for producing a NOR signal from the output signals of inverters 92 and 96, a NOR circuit 100 for producing a NOR signal from the output signals of the NOR circuit 98 and inverter 96, a MOS FET 102 having its drain connected with source +E and actuated in response to the output signal of NOR circuit 98 applied to its gate, and a MOS FET 104 having its drain grounded and actuated in response to the output signal of NOR circuit 100 applied its gate.

In operation, supposing that a detection signal from column line has "1" level and that a chip select $\overline{CS}$ signal has "0" level, the detection signal is inverted by inverter 92 to "0" level and the chip select signal is twice inverted by inverters 94 and 96 in series to "0" level. The detection and the chip select $\overline{SC}$ signal both of "0" level are fed to NOR circuit 98 which thereby produces a "1" level signal. The "1" level signal is fed to the gate of MOS FET 102 to turn the latter on. The "0" level chip select signal from inverter 96 and the "1" level signal from NOR circuit 100 which thereby produces a "0" level signal. The "0" level signal is fed to the gate of MOS FET 104 to turn the latter off. The output terminal signal has "1" level, with MOS FET's 102 and 104 being thus turned on and off, respectively. When a detection signal from column line has "0" level, conversely, MOS FET 102 is turned on, with MOS FET 104 off, so that the output terminal signal has "0" level. Charge on column lines can be detected in the foregoing manner.

In combination with the embodiment of FIG. 8, the inverter 92 in the voltage sensor of FIG. 10 is replaced by a NOR circuit to which column lines $4_1, 4_2, \ldots$ are connected.

Although the control signal C derived from the control signal generator 16 is only directed to control of the gates of MOS FET's $14_1, 14_2, \ldots$ in the foregoing description, the same signal may be fed to address buffer, decoder, and decoder buffer provided in combination with the memory device of FIG. 1, 3 or 8, to serve as a timing signal for reducing power consumption in these circuits.

Figure 11:
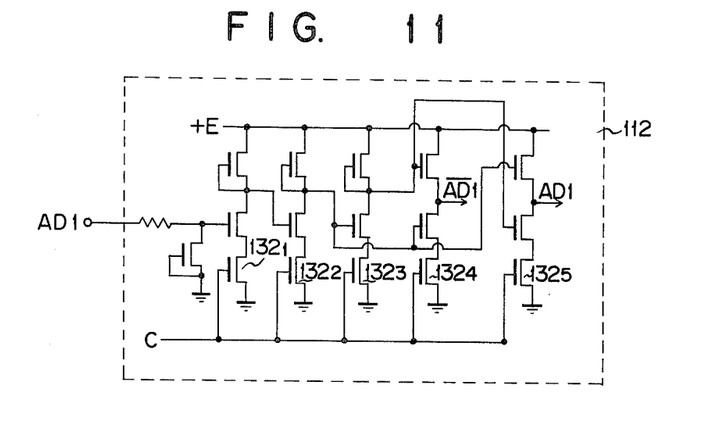
FIG. 11 is a schematic diagram of an address buffer.
Figure 12:
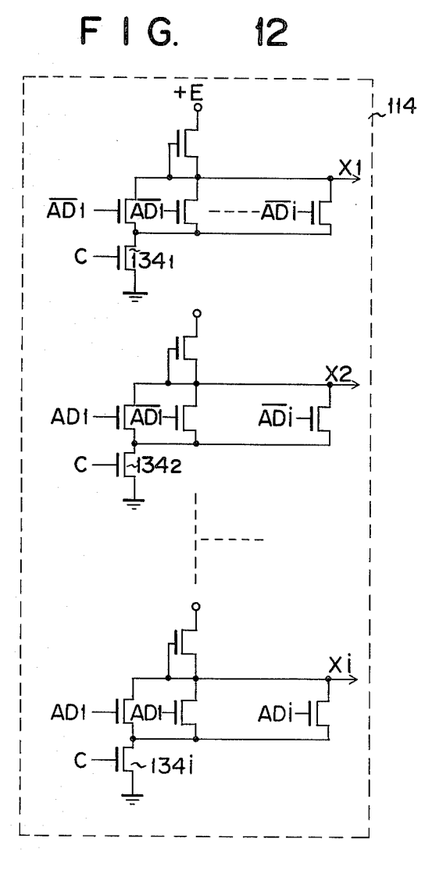
FIG. 12 is a schematic diagram of a decoder.
Figure 13:
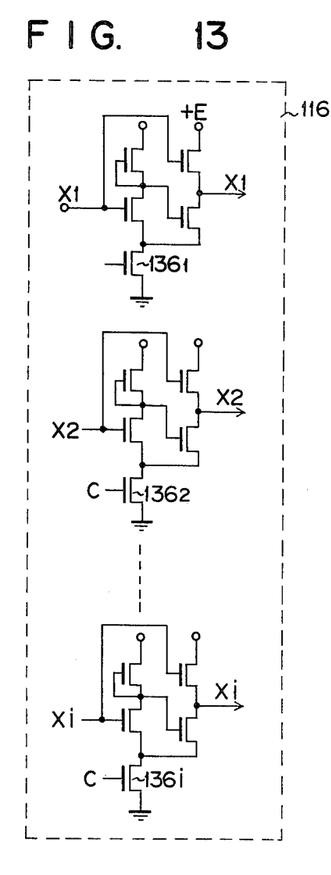
FIG. 13 is a schematic diagram of a decoder buffer.
Figure 14:
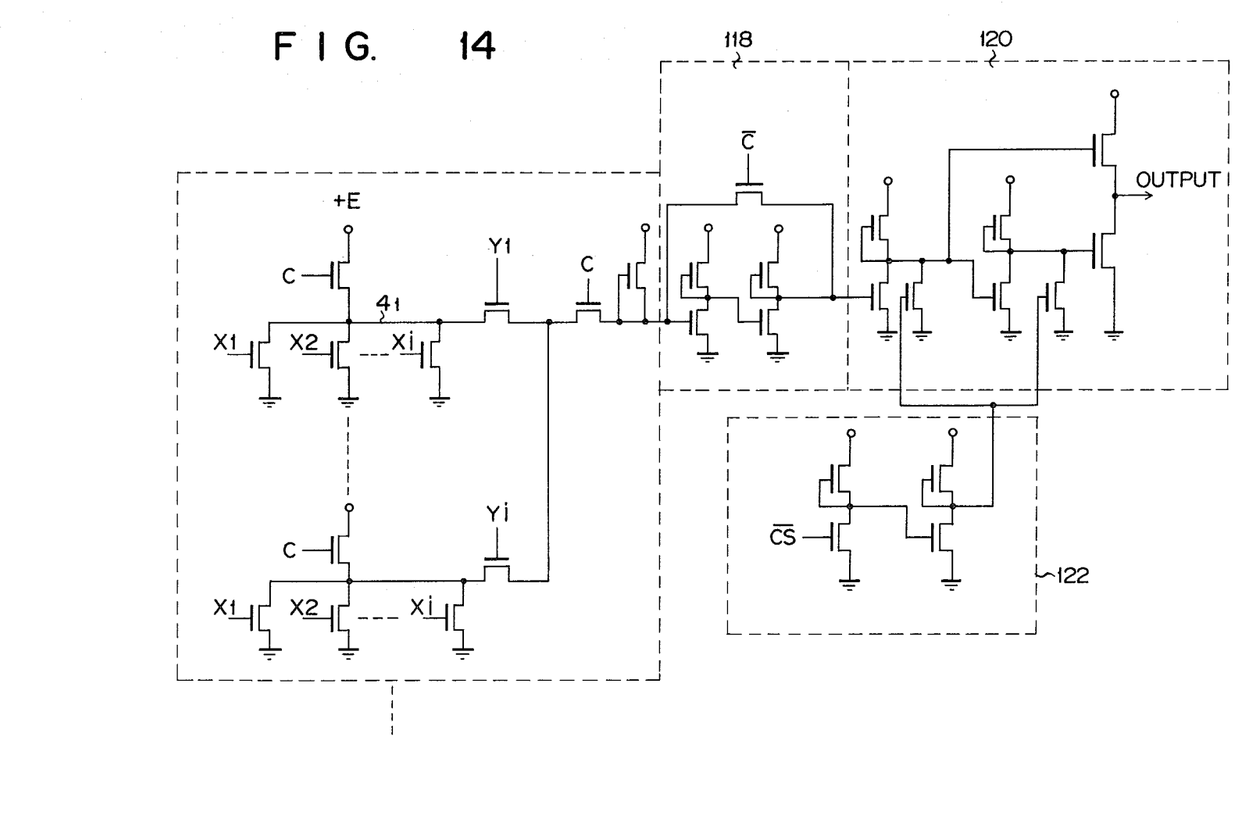
FIG. 14 is a schematic diagram of a combination of a data latch circuit and a voltage sensor.

In detail, select signals $X_1, X_2, \ldots$ to be applied to row lines $6_1, 6_2, \ldots$ in the embodiment of FIG. 1, 3, or 8 are provided by means of an address buffer 112 shown in FIG. 11, a decoder 114 shown in FIG. 12, and a decoder buffer 116 shown in FIG. 13. Similarly provided are select signals $Y_1, Y_2, \ldots$ to be applied to column selection MOS FET's $8_1, 8_2, \ldots$. Column lines $4_1, 4_2, \ldots$ are connected through a data latch circuit 118 shown in FIG. 14 to a voltage sensor consisting of an output buffer 120 and a chip select circuit 122. A semiconductor memory device incorporating address buffer 116, data latch circuit 118, output buffer 120, and chip select circuit 122 has a long period of time of the stand-by state while power consumption is caused mainly by address buffer 112, decoder 114 and decoder buffer 116. MOS FET means for power saving are connected to the inverter included in each of address buffer 112, decoder 114 and decoder buffer 116 for the purpose of saving power consumption in these circuits. The power saving means are constituted by MOS FET's $132_1, 132_2, \ldots 132_5$ in address buffer 112 of FIG. 11, MOS FET's $134_1, 134_2, \ldots 132_i$ in decoder 114 of FIG. 12, and MOS FET's $136_1, 136_2, \ldots 136_i$ in decoder buffer 116 of FIG. 13, which MOS FET's are applied at the gates with timing pulse signals which are, in the prior art, provided from an outside circuit.

Control signal produced by the control signal generator 16 which is formed together with the memory device in a semiconductor chip may be substituted for the above timing pulse signals derived from an outside circuit. Thus, such an outside circuit may be dispensed with for providing the control signals to address buffer 112, decoder 114, and decoder buffer 116. When control signal C has "0" level, a current is not permitted to flow in any other than data latch circuit 118, output buffer 120, and chip select circuit $\overline{CS}$ 122, so that a power consumption may be minimized in the course of the stand-by state of the memory device.

What we claim is:

1. A semiconductor memory device comprising a plurality of row lines, a plurality of memory cells controlled by a signal applied to said plurality of row lines, a plurality of column lines connected with said plurality of memory cells, column line select means for selecting one of said plurality of column lines, a load circuit connected between said plurality of column lines and a power source terminal, and means for applying a control pulse signal to said load circuit in synchronism with level change of an address signal to vary a resistance value of said load circuit.

2. A semiconductor memory device according to claim 1 further including a voltage sensor means connected with said plurality of column lines.

3. A semiconductor memory device comprising a plurality of row lines, a plurality of memory cells controlled by a signal applied to said plurality of row lines, a plurality of column lines connected with said plurality of memory cells, voltage sensor means connected with said plurality of column lines, column line select means connected between said plurality of column lines and said sensor means, a load circuit consisting of a pair of first and second load elements, said first load element being diode-connected and connected between a power source terminal and a junction at which said voltage sensor means and said column line select means are connected and said second load element being connected between said source terminal and a junction at which said column lines and said column line select means are connected, and means for applying a control pulse signal to said second load element in synchronism with level change of an address signal to vary a resistance value of said second load element.

4. A semiconductor memory device according to claim 3 wherein said first load element is constituted by a first MOS FET with its gate and its source connected commonly with each other, and said second load element is constituted by a second MOS FET.

5. A semiconductor memory device according to claim 4 wherein said first and second MOS FET's are of depletion and of enhancement types, respectively.

6. A semiconductor memory device according to claim 4 wherein said first and said second MOS FET's are both of depletion type.

7. A semiconductor memory device defined in claim 3 wherein said column line select means is constituted by a MOS FET.

8. A semiconductor memory device defined in claim 3 wherein said control pulse signal means comprises a delay circuit responsive to an address signal to derive a signal delayed by a determined length of time, an exclusive-OR circuit responsive to said address signal and said output signal of said delay circuit to generate an exclusive-OR signal thereof, and a NOR circuit for generating a NOR signal from the output signal of said exclusive-OR circuit.

9. A semiconductor memory device according to claim 3 wherein said control pulse signal means comprises a first inverter responsive to said address signal to derive a pulse signal in an inverted phase having a long rising and a short falling periods of time, a second inverter responsive to said address signal to derive a signal in an inverted phase, a third inverter responsive to the output of said second inverter to derive a pulse signal in an inverted phase having a long rising and a short falling periods of times, and a NOR circuit responsive to said output signal of said first inverter and said output signal of said third inverter to derive a NOR signal thereof.

10. A semiconductor memory device according to claim 3 wherein said voltage sensor means comprises a first inverter responsive to an output signal of said column lines to derive a signal in an inverted phase, a second inverter responsive to a chip select signal to derive a signal in an inverted phase, a third inverter responsive to the output signal of said first inverter to derive a signal in an inverted phase, a first NOR circuit responsive to the output signals of said first and said third inverters to generate a NOR signal thereof, a second NOR circuit responsive to the output signals of said first NOR circuit and said third inverter to generate a NOR signal thereof, and a series circuit of a pair of a first and a second MOS FET's connected in series between a power source terminal and a grounding point, said first MOS FET having the gate applied with the output signal of said first NOR circuit and said second MOS FET having the gate applied with the output signal of said second NOR circuit.

11. A semiconductor memory device comprising a plurality of row lines, a plurality of memory cells controlled by a signal applied to said plurality of row lines, a plurality of column lines connected with said plurality of memory cells, voltage sensor means connected with said plurality of column lines, column select means connected between said plurality of column lines and said voltage sensor means, a load circuit consisting of a pair of first and second load elements connected in parallel between a junction at which said column select means and said voltage sensor means are connected, and a power source terminal, said first load element being diode-connected, and means for applying a control pulse signal to said second load element in synchronism with level change of an address signal to vary a resistance value of said second load element.

12. A semiconductor memory device according to claim 11 wherein said first load element is constituted by a first MOS FET with its gate and its source connected commonly with each other, and said second load element is constituted by a second MOS FET.

13. A semiconductor memory device according to claim 12 wherein said first and said second MOS FET's are of depletion and of enhancement types, respectively.

14. A semiconductor memory device according to claim 12 wherein said first and said second MOS FET's are both of depletion type.

15. A semiconductor memory device according to claim 11 wherein said column select means is constituted by a MOS FET.

16. A semiconductor memory device according to claim 11 wherein said control pulse signal means comprises a delay circuit responsive to an address signal to derive a signal delayed by a determined length of time, an exclusive OR circuit responsive to said address signal and said output signal of said delay circuit to generate an exclusive-OR signal thereof, and a NOR circuit for generating a NOR signal from the output signal of said exclusive-OR circuit.

17. A semiconductor memory device according to claim 11 wherein said control pulse signal means comprises a first inverter responsive to said address signal to derive a pulse signal in an inverted phase having a long rising and a short falling periods of time, a second inverter responsive to said address signal to derive a signal in an inverted phase, a third inverter responsive to the output of said second inverter to derive a pulse signal in an inverted phase having a long rising and a short falling periods of times, and a NOR circuit responsive to said output signal of said first inverter and said output signal of said third inverter to derive a NOR signal thereof.

18. A semiconductor memory device according to claim 11 wherein said voltage sensor means comprises a first inverter responsive to an output signal of said column lines to derive a signal in an inverted phase, a second inverter responsive to a chip select signal to derive a signal in an inverted phase, a third inverter responsive to the output signal of said first inverter to derive a signal in an inverted phase, a first NOR circuit responsive to the output signals of said first and said third inverters to generate a NOR signal thereof, a second NOR circuit responsive to the output signals of said first NOR circuit and said third inverter to generate a NOR signal thereof, and a series circuit of a pair of a first and a second MOS FET's connected in series between a power source terminal and a grounding point, said first MOS FET having the gate applied with the output signal of said first NOR circuit and said second MOS FET having the gate applied with the output signal of said second NOR circuit.

19. A semiconductor memory device comprising a plurality of row lines, a plurality of memory cells controlled by a signal applied to said plurality of row lines, a plurality of column lines connected with said plurality of memory cells, voltage sensor means connected with said plurality of column lines, column select having a first terminal connected with said plurality of column lines and a second terminal grounded, a load circuit connected between said column lines and a power source terminal, and means for applying a control pulse signal to said load circuit in synchronism with level change of an address signal to vary a resistance value of said load circuit.

20. A semiconductor memory device comprising a plurality of row lines, a plurality of memory cells controlled by a signal applied to said plurality of row lines, a plurality of column lines connected with said plurality of memory cells, voltage sensor means connected with said plurality of column lines, column select means having a control terminal, and a first output terminal connected with the column lines and a second output terminal grounded, a load circuit consisting of a pair of first and second load elements connected in parallel between said column lines and a power source terminal, said first load element being diode-connected, and means for applying a control pulse signal to said second load element in synchronism with level change of an address signal to vary a resistance value of said second load element.

21. A semiconductor memory device according to claim 20 wherein said first load element is constituted by a first MOS FET with its gate and its source connected commonly with each other, and said second load element is constituted by a second MOS FET.

22. A semiconductor memory device according to claim 21 wherein said first and said second MOS FET's are of depletion and of enhancement types, respectively.

23. A semiconductor memory device according to claim 21 wherein said first and said second MOS FET's are both of depletion type.

24. A semiconductor memory device according to claim 20 wherein said column line select means is constituted by a MOS FET.

25. A semiconductor memory device according to claim 20 wherein said control pulse signal means comprises a delay cricuit responsive to an address signal to derive a signal delayed by a determined length of time, an exclusive-OR circuit responsive to said address signal and said output signal of said delay circuit to generate an exclusive-OR signal thereof, and a NOR circuit for generating a NOR signal from the output signal of said exclusive-OR circuit.

26. A semiconductor memory device according to claim 20 wherein said control pulse signal means comprises a first inverter responsive to said address signal to derive a pulse signal in an inverted phase having a long rising and a short falling periods of time, a second inverter responsive to said address signal to derive a signal in an inverted phase, a third inverter responsive to the output of said second inverter to derive a pulse signal in an inverted phase having a long rising and a short falling periods of times, and a NOR circuit responsive to said output signal of said first inverter and said output signal of said third inverter to derive a NOR signal thereof.

27. A semiconductor memory device according to claim 20 wherein said voltage sensor means comprises a first inverter responsive to an output signal of said column lines to derive a signal in an inverted phase, a second inverter responsive to a chip select signal to derive a signal in an inverted phase, a third inverter responsive to the output signal of said first inverter to derive a signal in an inverted phase, a first NOR circuit response to the output signals of said first and said third inverters to generate a NOR signal thereof, a second NOR circuit responsive to the output signals of said first NOR circuit and said third inverter to generate a NOR signal thereof, and a series circuit of a pair of a first and a second MOS FET's connected in series between a power source terminal and a grounding point, said first MOS FET having the gate applied with the output signal of said first NOR circuit and said second MOS FET having the gate applied with the output signal of said second NOR circuit.

28. A semiconductor memory device comprising a plurality of row lines, a plurality of memory cells controlled by a signal applied to said plurality of row lines, a plurality of column lines connected with said plurality of memory cells, voltage sensor means connected with said plurality of column lines, column lines select means for selecting one of said column lines, a depletion type MOS FET connected between said column lines and a power source terminal, and means for applying a control pulse signal to the gate of said MOS FET in synchronism with level change of an address signal thereby to vary a resistance value of said MOS FET.

29. A semiconductor memory device according to claim 28 wherein said control pulse signal means comprises a delay circuit responsive to an address signal to derive a signal delayed by a determined length of time, an exclusive-OR circuit responsive to said address signal and said output signal of said delay circuit to generate an exclusive-OR signal thereof, and a NOR circuit for generating a NOR signal from the output signal of said exclusive-OR circuit.

30. A semiconductor memory device according to claim 28 wherein said control pulse signal means comprises a first inverter responsive to said address signal to derive a pulse signal in an inverted phase having a long rising and a short falling periods of time, a second inverter responsive to said address signal to derive a signal in an inverted phase, a third inverter responsive to the output of said second inverter to derive a pulse signal in an inverted phase having a long rising and a short falling periods of times, and a NOR circuit responsive to said output signal of said first inverter and said output signal of said third inverter to derive a NOR signal thereof.

31. A semiconductor memory device according to claim 28 wherein said voltage sensor means comprises a first inverter responsive to an output signal of said column lines to derive a signal in an inverted phase, a second inverter responsive to a chip select signal to derive a signal in an inverted phase, a third inverter responsive to the output signal of said first inverter to derive a signal in an inverted phase, a first NOR circuit responsive to the output signals of said first and said third inverters to generate a NOR signal thereof, a second NOR circuit responsive to the output signals of said first NOR circuit and said third inverter to generate a NOR signal thereof, and a series circuit of a pair of a first and a second MOS FET's connected in series between a power source terminal and a grounding point, said first MOS FET having the gate applied with the output signal of said first NOR circuit and said second MOS FET having the gate applied with the output signal of said second NOR circuit.

32. A semiconductor memory device comprising a plurality of row lines, a plurality of memory cells connected with said plurality of row lines, a plurality of column lines connected with said plurality of memory cells, a row line designating means including an active element for decreasing power consumption produced therein, the row line designating means producing an output signal to designate one of said plurality of row lines, a column line designating means including an active element for decreasing power consumption produced therein the column line designating means producing an output signal to designate one of said plurality of column lines, a load circuit connected between said plurality of column lines and a power source terminal, and control pulse signal means for producing a control pulse signal in synchronism with level change of an address signal to vary a resistance value of said load circuit and to control an operation of said active elements of said row and column line designating means.

33. A seminconductor memory device according to claim 32 wherein said control pulse signal means comprises a delay circuit responsive to an address signal to derive a signal delayed by a determined length of time, an exclusive-OR circuit responsive to said address signal and said output signal of said delay circuit to generate an exclusive-OR signal thereof, and a NOR circuit for generating a NOR signal from the output signal of said exclusive-OR circuit.

34. A semiconductor memory device according to claim 32 wherein said active elements are MOS FET's.

* * * * *